(12) United States Patent
Kraft et al.

(10) Patent No.: US 7,416,948 B2
(45) Date of Patent: Aug. 26, 2008

(54) TRENCH FET WITH IMPROVED BODY TO GATE ALIGNMENT

(75) Inventors: Nathan L. Kraft, Pottsville, PA (US); Ashok Challa, Sandy, UT (US); Steven P. Sapp, Felton, CA (US); Hamza Yilmaz, Saratoga, CA (US); Daniel Calafut, San Jose, CA (US); Dean E. Probst, West Jordan, UT (US); Rodney S. Ridley, Scarborough, ME (US); Thomas E. Grebs, Mountaintop, PA (US); Christopher B. Kocon, Mountaintop, PA (US); Joseph A. Yedinak, Mountaintop, PA (US); Gary M. Dolny, Mountaintop, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 82 days.

(21) Appl. No.: 11/551,992

(22) Filed: Oct. 23, 2006

(65) Prior Publication Data

US 2007/0082441 A1 Apr. 12, 2007

Related U.S. Application Data

(63) Continuation-in-part of application No. 11/026,276, filed on Dec. 29, 2004, now Pat. No. 7,345,342.

(60) Provisional application No. 60/533,790, filed on Dec. 30, 2003.

(51) Int. Cl.
*H01L 21/336* (2006.01)

(52) U.S. Cl. .................. 438/270; 438/424; 438/524; 438/525; 257/E21.147; 257/E21.419; 257/E21.655

(58) Field of Classification Search ................. 438/269; 257/E21.147, E21.4, E21.419, E21.615
See application file for complete search history.

(56) References Cited

U.S. PATENT DOCUMENTS

| | | | |
|---|---|---|---|
| 6,274,437 B1 | 8/2001 | Evans | |
| 6,802,719 B2 | 10/2004 | Finney | |
| 2005/0242411 A1* | 11/2005 | Tso | .................. 257/480 |
| 2007/0032020 A1* | 2/2007 | Grebs et al. | ............... 438/272 |
| 2007/0069324 A1* | 3/2007 | Takaishi | ................. 257/493 |

* cited by examiner

*Primary Examiner*—Scott B. Geyer
*Assistant Examiner*—Cheung Lee
(74) *Attorney, Agent, or Firm*—Townsend and Townsend and Crew LLP (57) ABSTRACT

A field effect transistor is formed as follows. Trenches are formed in a semiconductor region of a first conductivity type. Each trench is partially filled with one or more materials. A dual-pass angled implant is carried out to implant dopants of a second conductivity type into the semiconductor region through an upper surface of the semiconductor region and through upper trench sidewalls not covered by the one or more material. A high temperature process is carried out to drive the implanted dopants deeper into the mesa region thereby forming body regions of the second conductivity type between adjacent trenches. Source regions of the first conductivity type are then formed in each body region.

44 Claims, 6 Drawing Sheets

TRENCH FET WITH IMPROVED BODY TO GATE ALIGNMENT

CROSS-REFERENCES TO RELATED APPLICATIONS

This application is a continuation-in-part of U.S. application Ser. No. 11/026,276, filed Dec. 29, 2004 now U.S. Pat. No. 7,345,342, which claims the benefit of U.S. Provisional Application No. 60/533,790, filed Dec. 30, 2003, both of which are incorporated herein by reference in their entirety for all purposes.

BACKGROUND OF THE INVENTION

The present invention relates in general to semiconductor power device technology and in particular to trench gate field effect transistors with improved body to gate alignment.

In conventional trench gate field effect transistors (FETs), the alignment of the body region to the bottom of the gate electrode impacts the transistor channel length and thus the on-resistance $R_{DS(on)}$ and gate-drain charge $Q_{GD}$. If the body region extends too deep, $R_{DS(on)}$ goes up and $Q_{GD}$ goes down. If the body region is too shallow, $Q_{GD}$ goes up and $R_{DS(on)}$ goes down. Unfortunately, this alignment is subject to large variations due to several factors including variations in the doping concentration of both the epitaxial layer and the body region that is formed in the epitaxial layer, the body drive-in process, and the trench recess. In more complex structures such as the shielded gate FET, additional factors such as shield electrode recess and the thickness of the inter-electrode dielectric (i.e., the dielectric layer that insulates the shield and gate electrodes from one another) can cause even larger variations. This high variation takes the form of a higher maximum rating on a data sheet and limits the product's marketability.

Thus, there is a need for techniques which provide a tighter control in the alignment of the body region to the bottom of the gate electrode in trench FETs.

BRIEF SUMMARY OF THE INVENTION

In accordance with an embodiment of the invention, a field effect transistor is formed as follows. Trenches are formed in a semiconductor region of a first conductivity type. Each trench is partially filled with one or more materials. A dual-pass angled implant is carried out to implant dopants of a second conductivity type into the semiconductor region through an upper surface of the semiconductor region and through upper trench sidewalls not covered by the one or more material. A high temperature process is carried out to drive the implanted dopants deeper into the mesa region thereby forming body regions of the second conductivity type between adjacent trenches. Source regions of the first conductivity type are then formed in each body region.

In one embodiment, the body region extends deeper near the trenches than in the middle of the mesa region between adjacent trenches.

In another embodiment, the trenches are partially filled by filling the trenches with a dielectric material, and then the dielectric material is recessed to a first depth within each trench.

In another embodiment, after the dual-pass angled implant, the dielectric material is further recessed wherein a remaining portion of the dielectric material forms a thick bottom dielectric in a bottom portion of each trench.

In another embodiment, the high temperature process is the process for forming a gate dielectric layer lining sidewalls of each trench.

In another embodiment, a gate dielectric layer lining sidewalls of each trench is formed, and the high temperature process includes a body drive-in process.

In another embodiment, a gate dielectric layer lining sidewalls of each trench is formed. A gate electrode is then formed in each trench. Source regions of the first conductivity type are formed in the body region. Heavy body regions of the second conductivity type are formed in the body regions such that the heavy body regions have a higher doping concentration than the body regions.

In another embodiment, the trenches are partially filled as follows. A bottom portion of each trench is filled with a shield electrode where the shield electrode is insulated from the semiconductor region. A remaining portion of each trench is filled with a dielectric material. The dielectric material is then recessed to a first depth within each trench.

In another embodiment, after the dual-pass angled implant, the dielectric material is further recessed whereby a remaining portion of the dielectric material forms an inter-electrode dielectric layer over the shield electrode in each trench.

In another embodiment, a shield dielectric layer lining lower sidewalls of each trench is formed where the shield dielectric layer insulates the shield electrode in each trench from the semiconductor region. A gate dielectric layer lining upper sidewalls of each trench is formed. The gate dielectric layer is thinner than the shield dielectric layer. A gate electrode is formed in an upper portion of each trench, where each gate electrode is insulated from its underlying shield electrode. Source regions of the first conductivity type are formed in the body region adjacent the trenches. Heavy body regions of the second conductivity type are formed in the body regions where the heavy body regions having a higher doping concentration than the body regions.

In another embodiment, the trenches are partially filled as follows. A shield dielectric layer lining sidewalls and bottom of each trench is formed. Each trench is filled with a conductive material. The conductive material is then recessed to a first depth within each trench.

In another embodiment, after the dual-pass angled implant, the conductive material is further recessed into each trench whereby a remaining portion of each conductive material forms a shield electrode in each trench.

In another embodiment, prior to the dual-pass angled implant, portions of the shield dielectric layer not covered by the recessed conductive material are thinned down.

In another embodiment, a gate dielectric layer lining upper sidewalls of each trench is formed where the gate dielectric layer is thinner than the shield dielectric layer. A gate electrode is formed in an upper portion of each trench such that each gate electrode is insulated from its underlying shield electrode. Source regions of the first conductivity type are formed in the body region adjacent the trenches. Heavy body regions of the second conductivity type are formed in the body region. The heavy body region has a higher doping concentration than the body region.

The following detailed description and the accompanying drawings provide a better understanding of the nature and advantages of the present invention.

DETAILED DESCRIPTION OF THE INVENTION

In accordance with embodiments of the invention, trench field effect devices with substantially improved alignment between the body region and the bottom of the gate electrode are formed. In one embodiment, a method for forming the body region of a trench FET which substantially minimizes variations in the depth of the body region is as follows. Trenches extending into a semiconductor region of a first conductivity type are partially filled with one or more materials. A dual-pass angled implant is then carried out to implant dopants of a second conductivity type into the semiconductor region through both the upper surface of the semiconductor region and the upper trench sidewalls not covered by the one or more material. A high temperature process (which can be the process for forming the gate dielectric or a rapid thermal anneal or a body drive-in) is then carried out to drive the implanted dopants deeper into the semiconductor region thereby forming body regions between adjacent trenches.

Because the body dopants are implant through the upper sidewalls of the trenches (in addition to the top surface of the semiconductor region) a substantial amount of the implanted dopants enter the semiconductor region at deeper locations than in conventional methods wherein all body dopants enter the semiconductor region through the top surface of the semiconductor region. Thus, the implanted dopants need not be driven as much as in conventional methods. This significantly reduces the body drive-in requirements, which minimizes variations in the depth of the body region. This technique is advantageously implemented in trench gate FETs as exemplified by the process sequence depicted by FIGS. 1A-1F, and in shielded gate FETs as exemplified by the process sequences depicted by FIGS. 2A-2F and 3A-3E. These exemplary embodiments are described in detail next.

Figure 1A:
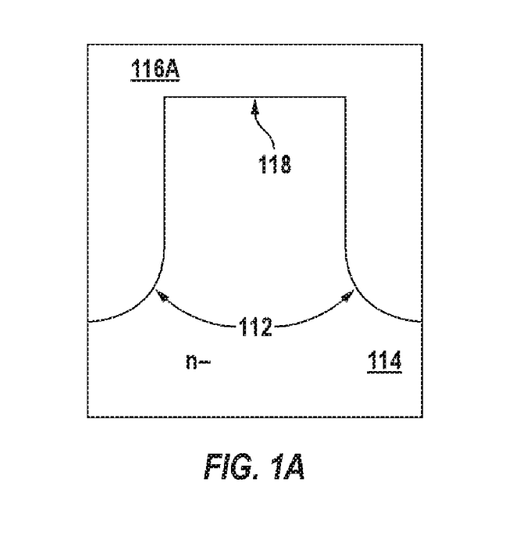
FIGS. 1A-1F show simplified cross section views at various stages of a process for forming a trench gate FET with improved body to gate alignment, according to one embodiment of the present invention.

FIGS. 1A-1F show simplified cross section views at various stages of a process for forming a trench gate FET with improved body to gate alignment, according to one embodiment of the present invention. In FIG. 1A, trenches 112 are formed in an n-type semiconductor region 114. In one embodiment, semiconductor region 114 includes a highly-doped n-type substrate (shown in FIG. 1F as region 142) with a lightly doped n-type epitaxial layer extending over the substrate, and trenches 112 may terminate either in the epitaxial layer or in the substrate depending on the design and performance goals. Trenches 112 are filled with a dielectric material 116A (e.g., comprising oxide) using conventional methods (e.g., oxide deposition). Dielectric material 116A may extend over the mesa regions between adjacent trenches 112. In this disclosure, "mesa region" is used to refer to the portion of the semiconductor region extending between adjacent trenches.

Figure 1B:
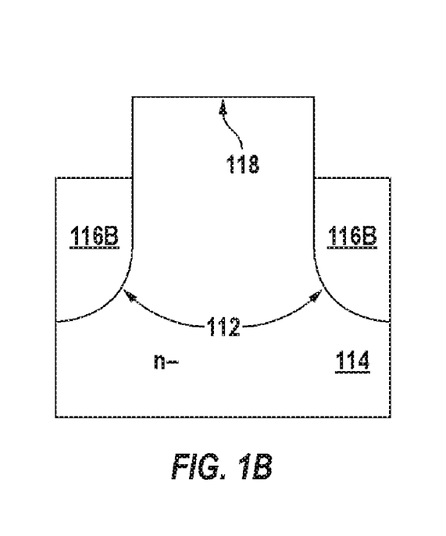
Figure 1C:
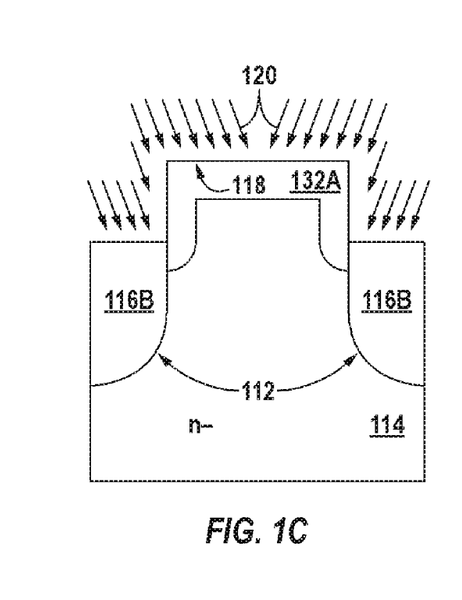

In FIG. 1B, a first dielectric recess is carried out to recess dielectric material 116A to a predetermined depth within trenches 112 using, for example, a timed dielectric etch such as wet etch. The depth to which dielectric material 116B is recessed is between top surface 118 of the mesa region and a bottom of the body region not yet formed. In FIG. 1C, without using a mask in the active region of the die, a dual-pass angled implant 120 is carried out whereby p-type dopants are implanted into the mesa region through both the top surface 118 of the mesa regions and the exposed upper trench sidewalls as shown. Recessed dielectric material 116B blocks implant dopants from entering the mesa region through the lower trench sidewalls. P-type region 132A is thus formed in upper portion of semiconductor region 114. Because of the angled implant through the exposed upper trench sidewalls, p-type region 132A extends deeper along the trench sidewalls than in the middle of the mesa region. The The implant dose and energy in part depend on the target threshold voltage and the drive-in process. In one embodiment where less drive-in process is used, a lower implant dose (e.g., in the range of $1 \times 10^{12}$ cm$^{-3}$ to $1 \times 10^{12}$ cm$^{-3}$) and a higher implant energy (e.g., in the range of 50 keV to 500 KeV) are used.

Figure 1D:
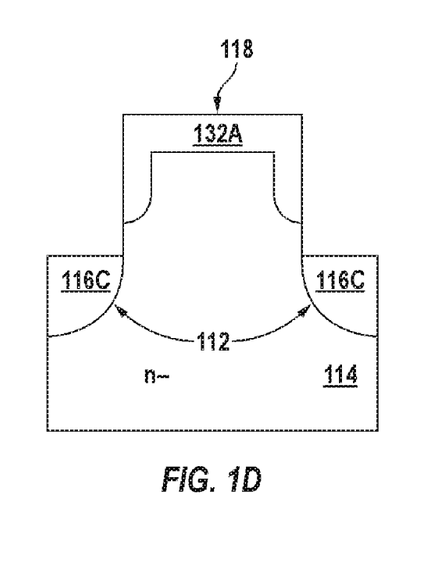
Figure 1E:
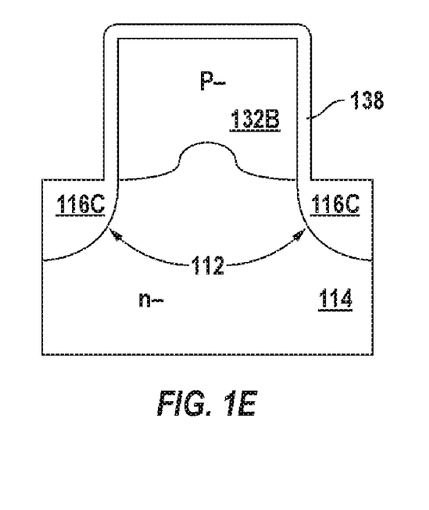

In FIG. 1D, dielectric material 116B is recessed again to its final depth, using for example a timed wet dielectric etch similar to that used in the first dielectric etch. A thick bottom dielectric 116C is thus formed in a bottom portion of trenches 112. In FIG. 1E, a gate dielectric layer 138 (e.g., comprising oxide) lining the trench sidewalls and extending over the exposed mesa surfaces is formed using known techniques (e.g., gate oxidation). A body drive-in is then carried out to drive the implanted dopants deeper to thereby form body region 132B. As can be seen, body region 132B has a raised middle profile due to the angled implant. In one embodiment, the same high temperature process used to form the gate dielectric serves to drive the body dopants deeper, and thus a separate body drive-in process is not required. Alternatively, a rapid thermal process is carried out only to activate the implanted dopants without driving them significantly.

The two-step dielectric etch and the intermediate dual-pass angled body implant provides a number of advantages. Because the body dopants are implanted through the upper sidewalls of the trenches, a substantial amount of the implanted dopants enter the mesa region at deeper locations than in conventional methods wherein all body dopants enter the mesa region through the top mesa surface. Thus, the implanted dopants need not be driven as deep as in conventional methods. This significantly reduces the body drive-in requirements which minimize variations in the depth of the body region. A better alignment is thus obtained between the body depth and the bottom of the gate electrode. The tighter control over this alignment enables the use of a shorter channel length which improves the on-state resistance $R_{DS(on)}$ and the gate-drain charge $Q_{GD}$. In one embodiment, the first dielectric etch recesses dielectric material 116A to a depth between the middle to the final target depth of the body region. In another embodiment, the body drive-in is minimized by ensuring that a significant amount (e.g., greater than 50%) of the final recess depth is obtained with the first dielectric recess.

Figure 1F:
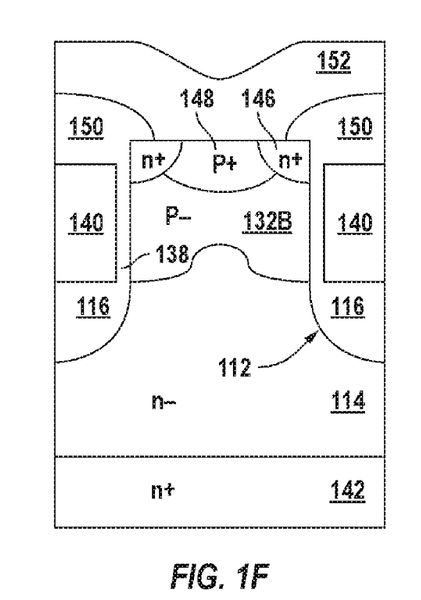

In FIG. 1F, a gate electrode 140 (e.g., comprising dope polysilicon) recessed in trenches 112 are formed using known techniques. Highly dope n-type source regions 146 and p-type heavy body regions 148 are formed in body region 132B using conventional techniques. Dielectric dome 150 (e.g., comprising BPSG) and the top-side interconnect layer 152 (e.g., comprising metal) contacting source regions 146 and heavy body regions 148 are formed using known methods. In other embodiments, dielectric material 150 is formed to have a top surface that is substantially coplanar with, or slightly recessed relative to, the top surface of the mesa region, such that interconnect layer 152 is substantially planar.

Similar advantages to those set forth above may be realized in shielded gate FETs by using similar techniques in forming the body region. In a shielded gate structure, the shield electrode or the inter-electrode dielectric (IED) may be used to obtain improved alignment between the body region and the bottom of the gate electrode. FIGS. 2A-2F depict an exemplary process sequence wherein the IED is used to obtain the improved body to gate alignment, in accordance with one embodiment of the invention.

Figure 2A:
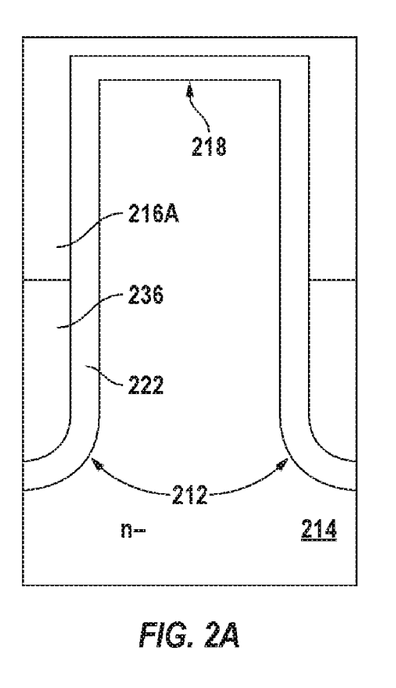
FIGS. 2A-2F show simplified cross section views at various stages of a process for forming a shielded gate FET with improved body to gate alignment, according to one embodiment of the present invention.

In FIG. 2A, trenches 212 are formed in a semiconductor region 214, using conventional silicon etch techniques. As in the prior embodiment, semiconductor region 214 may include a highly-doped n-type substrate (shown in FIG. 2F as region 242) with a lightly doped n-type epitaxial layer extending over the substrate. Trenches 212 may terminate either in the epitaxial layer or in the substrate depending on the design and performance goals. A shield dielectric layer 222 (e.g., comprising oxide) lining the trench sidewalls and bottom and extending over the mesa regions is formed using conventional techniques. A shield electrode 236 (e.g., comprising polysilicon) filling a lower portion of each trench 212 is formed using known methods. A dielectric material 216A (e.g., comprising oxide) is formed to fill trenches 112, using conventional methods (e.g., oxide deposition). Dielectric material 216A may extend over the mesa regions between trenches 212 as shown. In one embodiment, prior to forming dielectric material 216A, the exposed portions of shield dielectric layer 222 are removed. Alternatively, prior to forming dielectric material 216A, the exposed portions of shield dielectric layer 222 are thinned down so that a thin layer of dielectric remains along upper trench sidewalls and over the mesa surfaces so that the later dual-pass implant (FIG. 2C) is carried out through the thin layer of dielectric.

Figure 2B:
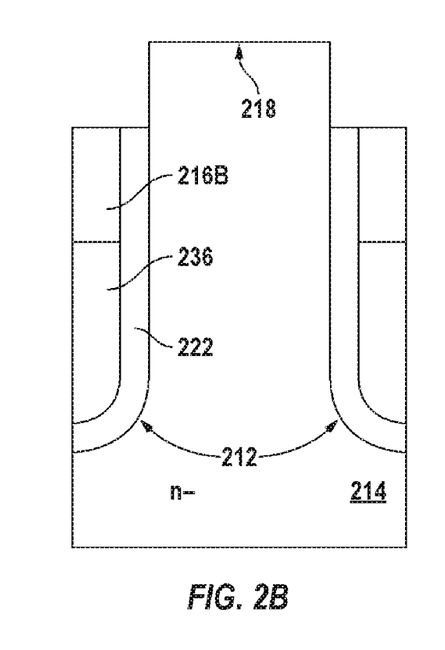
Figure 2C:
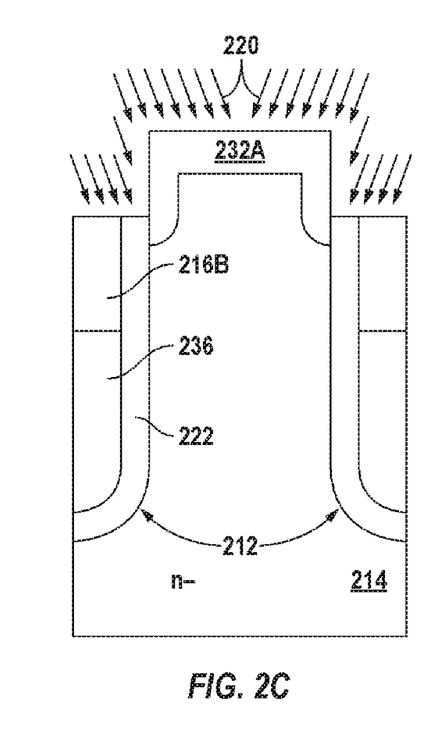

In FIG. 2B, a first dielectric recess is carried out to recess dielectric material 216A and the shield dielectric 222 to a first depth within trenches 212, using for example, a timed dielectric etch such as wet etch. The depth to which dielectric material 216A is recessed is between top surface 218 of the semiconductor region 214 and a bottom of the body region which has not yet been formed. In FIG. 2C, without using a mask in the active region of the die, a two-pass angled implant 220 is carried out whereby p-type dopants are implanted into the mesa region through top surface 218 of the mesa region and the exposed upper trench sidewalls as shown. P-type region 232A is thus formed in an upper portion of semiconductor region 214. As a result of the angled implant into the exposed upper trench sidewalls, p-type region 232A extends deeper along the trench sidewalls than in the middle of the mesa region.

Figure 2D:
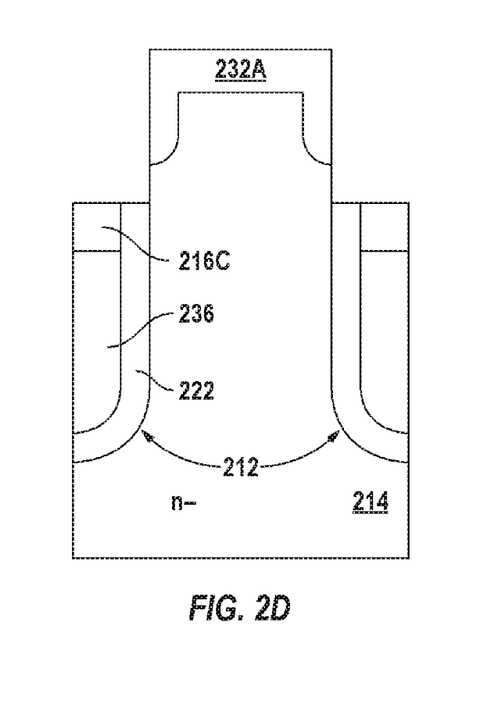
Figure 2E:
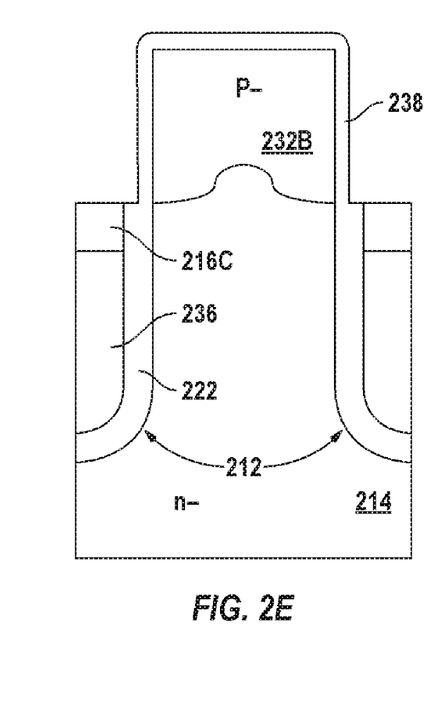

In FIG. 2D, dielectric layer 216B and shield electrode 222 are recessed a second time to a final depth, using for example a timed wet dielectric etch similar to that used in the first dielectric etch. An inter-electrode dielectric 216C is thus formed over each shield electrode 224. In FIG. 2E, a gate dielectric layer 238 (e.g., comprising oxide) lining the upper trench sidewalls and extending over the exposed mesa surfaces is formed using known techniques (e.g., gate oxidation). A body drive-in is then carried out to drive the implanted dopants deeper to thereby form body region 232B. As can be seen, body region 232B has a raised middle profile due to the angled implant. In one embodiment, the same high temperature process used to form the gate dielectric serves to drive in the body dopants deeper, and thus a separate body drive-in process is not required. Alternatively, a rapid thermal process is carried out only to activate the implanted dopants without driving them significantly.

The two-step dielectric etch and the intermediate angled body implant is especially beneficial in the shielded gate structure because the shield electrode and the inter-electrode dielectric (which are not present in the previous embodiment) cause even greater variations in the alignment between the body region and the bottom of the gate electrode. The improved alignment enables significant shortening of the channel length which in turn substantially improves the on-state resistance $R_{DS(on)}$ and the gate-drain charge $Q_{GD}$. In one embodiment, the first dielectric etch recesses dielectric material 216A to a depth between the middle to the final target depth of the body region. In another embodiment, a significant amount (e.g., greater than 50%) of the final dielectric recess depth is obtained with the first dielectric recess.

Figure 2F:
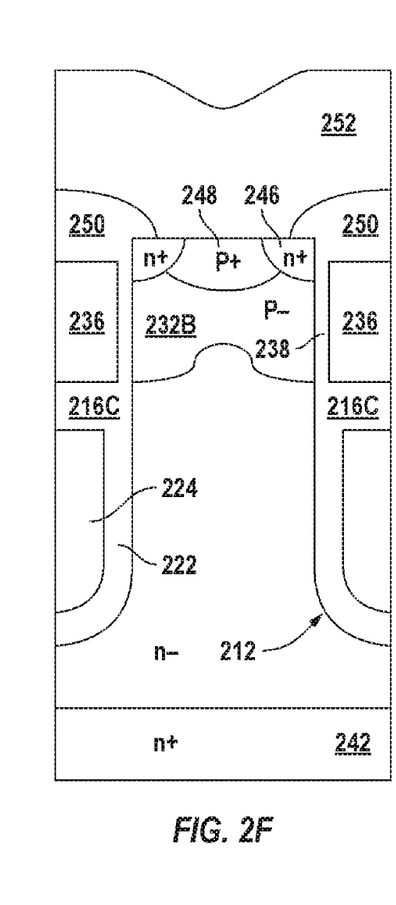

In FIG. 2F, a gate electrode 236 (e.g., comprising dope polysilicon) recessed in each trench 212 is formed using known techniques. Highly dope n-type source regions 246 and p-type heavy body regions 248 are formed in body region 232B using conventional techniques. Dielectric dome (e.g., comprising BPSG) and the top-side interconnect layer 252 (e.g., comprising metal) contacting source regions 246 and heavy body regions 248 is formed using known methods. In other embodiments, dielectric material 250 is formed to have a top surface that is substantially coplanar with, or slightly recessed relative to, the top surface of the mesa region, such that interconnect layer 252 is substantially planar.

Figure 3A:
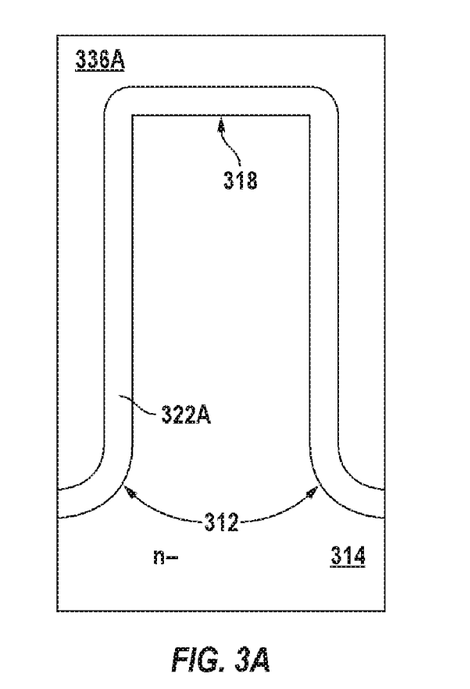
FIGS. 3A-3E show simplified cross section views at various stages of another process for forming a shielded gate FET with improved body to gate alignment, according to another embodiment of the present invention.

FIGS. 3A-3F depict an exemplary process sequence wherein the shield electrode is used to obtain the improved body to gate alignment, in accordance with another embodiment of the invention. In FIG. 3A, trenches 312 are formed in semiconductor region 214 using conventional silicon etch techniques. As in the prior embodiments, semiconductor region 314 may include a highly-doped n-type substrate with a lightly doped n-type epitaxial layer extending over the substrate. Trenches 312 may terminate either in the epitaxial layer or in the substrate. A shield dielectric layer 322A lining the trench sidewalls and bottom and extending over the mesa regions is formed using conventional techniques. A conductive material 336A (e.g., comprising polysilicon) filling trenches 312 is formed using known methods.

Figure 3B:
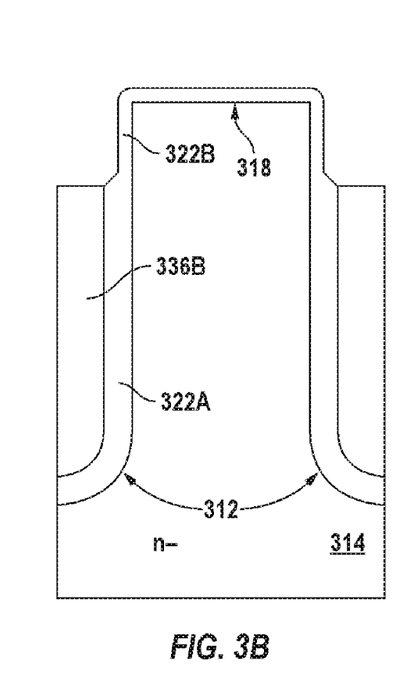
Figure 3C:
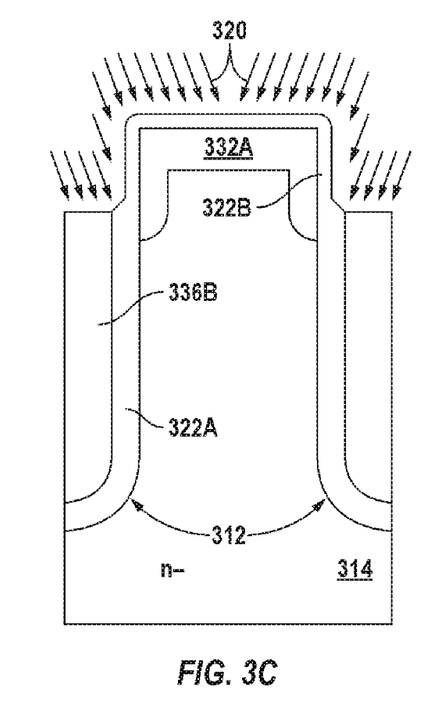

In FIG. 3B, a first shield electrode recess is carried out to recess conductive material 336A to a first depth within trenches 312, using known techniques. The first depth would be between the top surface 318 of the mesa region and a bottom of the body region which has not yet been formed. The exposed portions of shield dielectric layer 322A are thinned down in preparation for the subsequent body implant. In FIG. 3C, without using a mask in the active region of the die, a two-pass angled implant 320 is carried out whereby p-type dopants are implanted into the mesa region through top surface 318 of the mesa region and through the upper trench sidewalls not covered by the recessed conductive material 336B. P-type region 332A is thus formed. As a result of the angled implant through the upper trench sidewalls, p-type region 332A extends deeper along the trench sidewalls than in the middle of the mesa region.

Figure 3D:
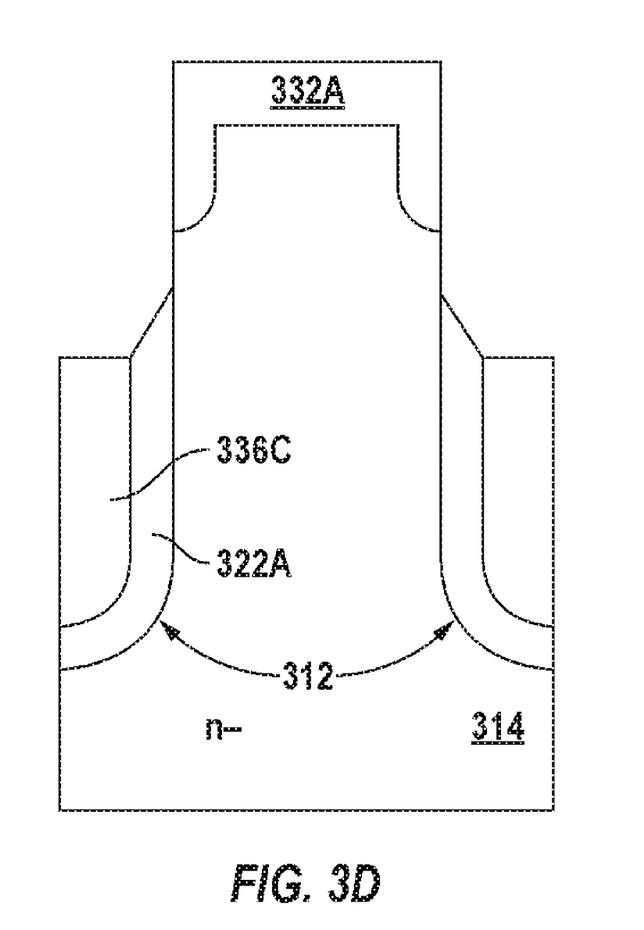
Figure 3E:
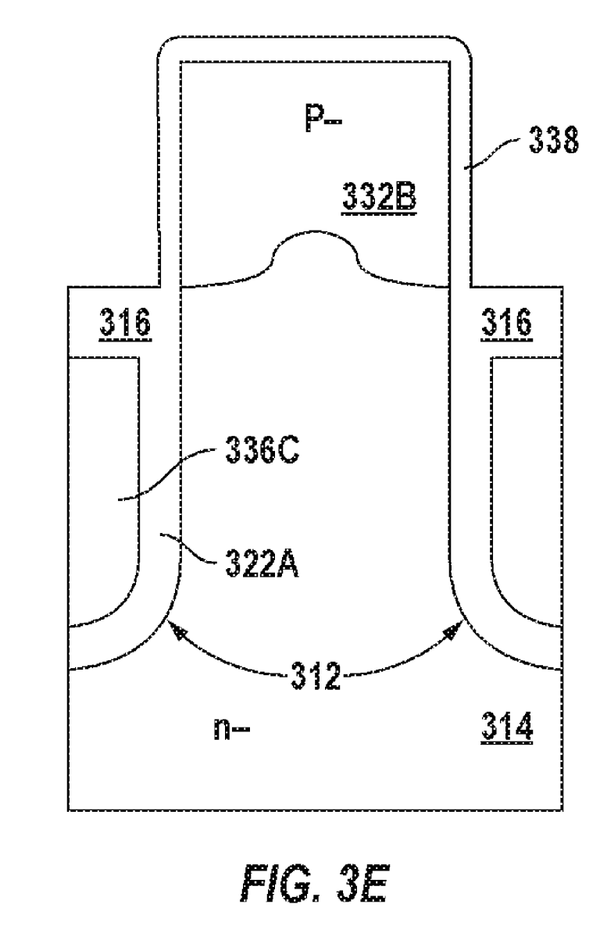

In FIG. 3D, conductive material 336B is further recessed to its final depth. The thinned down portions 322B of the shield dielectric layer prevent recessing of the mesa regions when conductive material 336B is being recessed. After, recessing of the conductive material to its final depth, the exposed portions of the shield dielectric layer are removed. An inter-electrode dielectric 316 is then formed over each shield electrode 224 using known techniques or one of the techniques disclosed in the above-referenced application. In FIG. 3E, a gate dielectric layer 338 (e.g., comprising oxide) lining the upper trench sidewalls and extending over the mesa surfaces is formed using known techniques (e.g., gate oxidation).

A body drive-in process is then carried out to drive the implanted dopants deeper thereby forming body region 332B. As can be seen, body region 332B has a raised middle profile due to the angled implant. In one embodiment, the same high temperature process used to form the gate dielectric serves to drive in the body dopants deeper, and thus a separate body drive-in process is not required. Alternatively, a rapid thermal process is carried out only to activate the implanted dopants without driving them significantly.

The subsequent process steps for completing the structure are similar to those described above in connection with FIG. 2F, and thus will not be repeated. The advantages of this embodiment are similar to those of the FIGS. 3A-3F embodiment outlined above.

Although a number of specific embodiments are shown and described above, embodiments of the invention are not limited thereto. For example, while the techniques according to embodiments of the invention are implemented in n-channel FETs, the techniques may also be implemented in p-channel FET by merely changing the conductivity type of the various regions. Also, while the techniques are implemented in MOSFET, they may also be implemented in IGBTs by merely using the opposite conductivity type substrate to the embodiments described above. Additionally, while the various embodiments described above are implemented in conventional silicon, these embodiments and their obvious variants can also be implemented in silicon carbide, gallium arsenide, gallium nitride, diamond or other semiconductor materials. Further, the features of one or more embodiments of the invention may be advantageously combined with features of one or more embodiments disclosed in the above-referenced application to obtain further improvements in device performance and physical characteristics without departing from the scope of the invention.

Therefore, the scope of the present invention should be determined not with reference to the above description but should, instead, be determined with reference to the appended claims, along with their full scope of equivalents.

What is claimed is:

1. A method of forming a field effect transistor, comprising:
   forming trenches in a semiconductor region of a first conductivity type;
   partially filling each trench with one or more materials;
   performing a dual-pass angled implant to implant dopants of a second conductivity type into the semiconductor region through an upper surface of the semiconductor region and through upper trench sidewalls not covered by the one or more material;
   performing a high temperature process to drive the implanted dopants deeper into mesa region thereby forming body regions of the second conductivity type between adjacent trenches; and
   forming source regions of the first conductivity type in each body region.

2. The method of claim 1 wherein the body region extends deeper near the trenches than in the middle of the mesa region between adjacent trenches.

3. The method of claim 1 wherein the step of partially filling the trenches comprises:
   filling the trenches with a dielectric material; and
   performing a first dielectric recess to recess the dielectric material to a first depth within each trench.

4. The method of claim 3 further comprising:
   after the dual-pass angled implant, performing a second dielectric recess to further recess the dielectric material, wherein a remaining portion of the dielectric material after the second dielectric recess forms a thick bottom dielectric in a bottom portion of each trench.

5. The method of claim 4 wherein the high temperature process comprises forming a gate dielectric layer lining sidewalls of each trench.

6. The method of claim 4 further comprising forming a gate dielectric layer lining sidewalls of each trench, wherein the high temperature process comprises a body drive-in process.

7. The method of claim 4 further comprising:
   forming a gate dielectric layer lining sidewalls of each trench;
   forming a gate electrode in each trench;
   forming source regions of the first conductivity type in the body region; and
   forming heavy body regions of the second conductivity type in the body regions, the heavy body regions having a higher doping concentration than the body regions.

8. The method of claim 1 wherein the step of partially filling the trenches comprises:
   filling a bottom portion of each trench with a shield electrode, the shield electrodes being insulated from the semiconductor region;
   filling a remaining portion of each trench with a dielectric material;
   performing a first dielectric recess to recess the dielectric material to a first depth within each trench.

9. The method of claim 8 further comprising:
   after the dual-pass angled implant, performing a second dielectric recess to further recess the dielectric material wherein a remaining portion of the dielectric material after the second dielectric recess forms an inter-electrode dielectric layer over the shield electrode in each trench.

10. The method of claim 9 wherein the high temperature process comprises forming a gate dielectric layer lining upper sidewalls of each trench.

11. The method of claim 9 further comprising forming a gate dielectric layer lining upper sidewalls of each trench, wherein the high temperature process comprises a body drive-in process.

12. The method of claim 9 further comprising:
   forming a shield dielectric layer lining lower sidewalls of each trench, the shield dielectric layer insulating the shield electrode in each trench from the semiconductor region;
   forming a gate dielectric layer lining upper sidewalls of each trench, the gate dielectric layer being thinner than the shield dielectric layer;
   forming a gate electrode in an upper portion of each trench, each gate electrode being insulated from its underlying shield electrode;
   forming source regions of the first conductivity type in the body region adjacent the trenches; and
   forming heavy body regions of the second conductivity type in the body regions, the heavy body regions having a higher doping concentration than the body regions.

13. The method of claim 1 wherein the step of partially filling the trenches comprises:
   forming a shield dielectric layer lining sidewalls and bottom of each trench;
   filling each trench with a conductive material; and
   recessing the conductive material to a first depth within each trench.

14. The method of claim 13 further comprising:
   after the dual-pass angled implant, further recessing the conductive material into each trench, a remaining portion of each conductive material forming a shield electrode in each trench.

15. The method of claim 14 further comprising:
   prior to performing the dual-pass angled implant, thinning down portions of the shield dielectric layer not covered by the recessed conductive material.

16. The method of claim 14 wherein the high temperature process comprises forming a gate dielectric layer lining upper sidewalls of each trench.

17. The method of claim 14 further comprising forming a gate dielectric layer lining upper sidewalls of each trench, wherein the high temperature process comprises a body drive-in process.

18. The method of claim 14 further comprising:
   forming a gate dielectric layer lining upper sidewalls of each trench, the gate dielectric layer being thinner than the shield dielectric layer;
   forming a gate electrode in an upper portion of each trench, each gate electrode being insulated from its underlying shield electrode;
   forming source regions of the first conductivity type in the body region adjacent the trenches; and
   forming heavy body regions of the second conductivity type in the body region, the heavy body regions having a higher doping concentration than the body region.

19. A method of forming a field effect transistor, comprising:
   forming trenches in a semiconductor region of a first conductivity type;
   filling the trenches with a dielectric material;
   recessing the dielectric material to a first depth within each trench;
   performing a dual-pass angled implant to implant dopants of a second conductivity type into mesa regions between adjacent trenches through upper trench sidewalls not covered by the recessed dielectric material;
   after the dual-pass angled implant, further recessing the recessed dielectric material; and
   performing a high temperature process to drive the implanted dopants deeper into the mesa region to thereby form a body region of the second conductivity type in the semiconductor region.

20. The method of claim 19 wherein a remaining portion of the dielectric material after the second dielectric recess forms a thick bottom dielectric in a bottom portion of each trench.

21. The method of claim 19 wherein the high temperature process comprises forming a gate dielectric layer lining sidewalls of each trench.

22. The method of claim 19 further comprising forming a gate dielectric layer lining sidewalls of each trench, wherein the high temperature process comprises a body drive-in process.

23. The method of claim 19 further comprising:
   forming a gate dielectric layer lining sidewalls of each trench; and
   forming a gate electrode in each trench.

24. The method of claim 19 further comprising:
   forming source regions of the first conductivity type in the body region;
   forming heavy body regions of the second conductivity type in the body region, the heavy body regions having a higher doping concentration than the body region.

25. The method of claim 19 wherein the body region extends deeper near the trenches than in the middle of the mesa region between adjacent trenches.

26. The method of claim 19 wherein the semiconductor includes a substrate and an epitaxial layer extending over the substrate, the epitaxial layer having a lower doping concentration than the substrate, the trenches extending into and terminating within the epitaxial layer.

27. A method of forming a shielded gate field effect transistor, comprising:
   forming trenches in a semiconductor region of a first conductivity type;
   filling a bottom portion of each trench with a shield electrode, the shield electrodes being insulated from the semiconductor region;
   filling a remaining portion of each trench with a dielectric material;
   recessing the dielectric material to a first depth within each trench;
   performing a dual-pass angled implant to implant dopants of a second conductivity type into mesa regions between adjacent trenches through upper trench sidewalls not covered by the recessed dielectric material;
   after the dual-pass angled implant, further recessing the recessed dielectric material; and
   performing a high temperature process to drive the implanted dopants deeper into the mesa region to thereby form a body region of the second conductivity type in the semiconductor region.

28. The method of claim 27 wherein a remaining portion of the dielectric material after the two recessing steps forms an inter-electrode dielectric layer over the shield electrode in each trench.

29. The method of claim 27 wherein the high temperature process comprises forming a gate dielectric layer lining upper sidewalls of each trench.

30. The method of claim 27 further comprising forming a gate dielectric layer lining upper sidewalls of each trench, wherein the high temperature process comprises a body drive-in process.

31. The method of claim 27 further comprising:
   forming a shield dielectric layer lining lower sidewalls of each trench, the shield dielectric layer insulating the shield electrode in each trench from the semiconductor region;
   forming a gate dielectric layer lining upper sidewalls of each trench, the gate dielectric layer being thinner than the shield dielectric layer; and
   forming a gate electrode in each trench in an upper portion of each trench, each gate electrode being insulated from its underlying shield electrode.

32. The method of claim 27 further comprising:
   forming source regions of the first conductivity type in the body region adjacent the trenches;
   forming heavy body regions of the second conductivity type in the body region, the heavy body regions having a higher doping concentration than the body region.

33. The method of claim 27 wherein the body region extends deeper near the trenches than in the middle of the mesa region between adjacent trenches.

34. The method of claim 27 wherein the semiconductor includes a substrate and an epitaxial layer extending over the substrate, the epitaxial layer having a lower doping concentration than the substrate, the trenches extending into and terminating within the epitaxial layer.

35. The method of claim 27 wherein the semiconductor includes a substrate and an epitaxial layer extending over the substrate, the epitaxial layer having a lower doping concentration than the substrate, the trenches extending through the epitaxial layer and terminating within the substrate.

36. A method of forming a shielded gate field effect transistor, comprising:
   forming trenches in a semiconductor region of a first conductivity type;

forming a shield dielectric layer lining sidewalls and bottom of each trench;

filling each trench with a conductive material;

recessing the conductive material to a first depth within each trench;

performing a dual-pass angled implant to implant dopants of a second conductivity type into mesa regions between adjacent trenches through upper trench sidewalls not covered by the recessed conductive material;

after the dual-pass angled implant, further recessing the conductive material into each trench, a remaining portion of each conductive material forming a shield electrode in each trench; and performing a high temperature process to drive the implanted dopants deeper into the mesa region to thereby form a body region of the second conductivity type in the semiconductor region.

37. The method of claim 36 further comprising:
prior to performing the dual-pass angled implant, thinning down portions of the shield dielectric layer not covered by the recessed conductive material.

38. The method of claim 36 wherein the high temperature process comprises forming a gate dielectric layer lining upper sidewalls of each trench.

39. The method of claim 36 further comprising forming a gate dielectric layer lining upper sidewalls of each trench, wherein the high temperature process comprises a body drive-in process.

40. The method of claim 36 further comprising:
forming a gate dielectric layer lining upper sidewalls of each trench, the gate dielectric layer being thinner than the shield dielectric layer; and forming a gate electrode in each trench in an upper portion of each trench, each gate electrode being insulated from its underlying shield electrode.

41. The method of claim 36 further comprising:
forming source regions of the first conductivity type in the body region adjacent the trenches;

forming heavy body regions of the second conductivity type in the body region, the heavy body regions having a higher doping concentration than the body region.

42. The method of claim 36 wherein the body region extends deeper near the trenches than in the middle of the mesa region between adjacent trenches.

43. The method of claim 36 wherein the semiconductor includes a substrate and an epitaxial layer extending over the substrate, the epitaxial layer having a lower doping concentration than the substrate, the trenches extending into and terminating within the epitaxial layer.

44. The method of claim 36 wherein the semiconductor includes a substrate and an epitaxial layer extending over the substrate, the epitaxial layer having a lower doping concentration than the substrate, the trenches extending through the epitaxial layer and terminating within the substrate.

* * * * *

UNITED STATES PATENT AND TRADEMARK OFFICE
CERTIFICATE OF CORRECTION

PATENT NO.        : 7,416,948 B2
APPLICATION NO.   : 11/551992
DATED             : August 26, 2008
INVENTOR(S)       : Nathan L. Kraft et al.

It is certified that error appears in the above-identified patent and that said Letters Patent is hereby corrected as shown below:

Column 4, line 7, "The The" should be changed to "The"

Column 4, line 50, "dope," should be changed to "doped"

Column 4, line 52, "dope" should be changed to "doped"

Column 6, line 9, "dope" should be changed to "doped"

Column 6, line 11, "dope" should be changed to "doped"

Signed and Sealed this

Twenty-third Day of December, 2008

JON W. DUDAS
*Director of the United States Patent and Trademark Office*